United States Patent [19]

Fukushima

[11] Patent Number: 4,943,742
[45] Date of Patent: Jul. 24, 1990

[54] SCHOTTKY BARRIER DIODE CLAMP TRANSISTOR

[75] Inventor: Toshitaka Fukushima, Yokohama, Japan

[73] Assignee: Fujitsu Limited, Kawasaki, Japan

[21] Appl. No.: 333,756

[22] Filed: Apr. 4, 1989

Related U.S. Application Data

[63] Continuation of Ser. No. 66,746, filed as PCT JP86/00505 on Oct. 3, 1986, published as WO87/02182 on Apr. 9, 1987, abandoned.

[30] Foreign Application Priority Data

Oct. 3, 1985 [JP] Japan .................. 60-219171

[51] Int. Cl.$^5$ ................ H03K 19/013; H03K 19/088; H03K 19/092; H03K 19/084
[52] U.S. Cl. .................... 307/458; 307/454; 357/15; 357/35; 357/36
[58] Field of Search ............. 307/457–460, 307/475, 477, 446, 317 A, 299.1, 563, 547, 549, 553, 558, 559; 357/15, 92, 34, 35, 36, 51

[56] References Cited

U.S. PATENT DOCUMENTS

| | | | |
|---|---|---|---|
| 4,129,790 | 12/1978 | Gani et al. | 307/458 X |
| 4,165,470 | 8/1979 | Fulkerson et al. | 307/458 X |
| 4,178,603 | 12/1979 | Muendel | 357/15 |
| 4,330,723 | 5/1982 | Griffith | 307/458 X |
| 4,595,942 | 6/1986 | Lohstroh | 307/458 X |
| 4,682,057 | 7/1987 | Doyle | 307/458 X |
| 4,728,824 | 3/1988 | Van Zantel | 307/458 X |

FOREIGN PATENT DOCUMENTS

| | | |
|---|---|---|
| 51-98985 | 8/1976 | Japan . |
| 53-31976 | 3/1978 | Japan . |
| 1572797 | 8/1980 | United Kingdom ........... 307/458 |

OTHER PUBLICATIONS

Heald et al, "Design of Schottky-Barrier Diode Clamped Transistor Layouts", IEEE JSSC, vol. SC-8, No. 4, pp. 269–275, Aug. 1973.
Lohstroh et al, "Oxide Isolated ISL Technologies", IEEE Electron Device Letters, vol. EDL-2, No 2, pp. 29–31, Feb. 1981.

Primary Examiner—Stanley D. Miller
Assistant Examiner—David R. Bertelson
Attorney, Agent, or Firm—Staas & Halsey

[57] ABSTRACT

A semiconductor device used for, particularly, an output stage of a logic circuit is formed by a Schottky.barrier.diode clamping transistor. A clamping circuit is provided between a collector and a base for clamping a collector potential. The clamping circuit is formed by a Schottky.barrier.diode (SBD) and a series connected resistance coupled to the Schottky.barrier.diode. A collector resistance is divided by resistance division using the series resistance (FIG. 6).

5 Claims, 9 Drawing Sheets

LIST OF REFERENCES $R_0$, $R_1$, $R_2$, $R_3$, $R_B$ ..... resistance,
D ........................... diode,
SBD ........................ Schottky·barrier·diode,
$Tr_1$, $TR_1$ .................. multiemitter transistor,
$Tr_2$, $Tr_3$, $Tr_4$ ............ transistor
$TR_2$, $TR_3$, $TR_4$ ............ SBD transistor

SCHOTTKY BARRIER DIODE CLAMP TRANSISTOR

This is a continuation of co-pending application Ser. No. 66,746, filed as PCT JP86/00505 on Oct. 3, 1986, published as WO87/02182 on Apr. 9, 1987, now abandoned.

BACKGROUND OF THE INVENTION

The present invention relates to a semiconductor device, particularly to a structure of a Schottky. barrier.diode clamp transistor (below, SBD transistor). The SBD transistor according to the present invention is very effective for increasing the margin of an output voltage at a low level side, and improving a switching speed, when used as an output transistor of a logic circuit of a digital circuit, for example, TTL (Transistor Transistor Logic) or ECL (Emitter Coupled Logic).

As an example of a conventional logic circuit, a TTL circuit is shown in FIG. 1. As it is well known, the operation of the circuit shown in FIG. 1 is explained only briefly, as follows. That is, when both input voltages $V_{IN1}$ and $V_{IN2}$ become high (H) level, a base current of an input multiemitter transistor $Tr_1$ flows to a base of a transistor $Tr_2$ and the transistor $Tr_2$ is turned ON, then an output transistor $Tr_4$ is turned ON and an output voltage $V_{OUT}$ becomes low (L) level. Conversely, when any input voltage becomes L level, base charges of the transistor $Tr_2$ are pulled out through a transistor gate and the transistor $Tr_2$ is turned OFF. At that time, base charges of the output transistor $Tr_4$ are pulled out to a ground (GND) side through a relatively low base resistor $R_B$. At the same time, the transistor $Tr_3$ connected to a collector of the transistor $Tr_2$, which has been turned OFF before the final stage is turned OFF, is driven. The transistor $Tr_3$ of the buffer stage operates to forcibly raise the collector potential of the output transistor $Tr_4$ so that the switching speed of the transistor $Tr_4$ can be raised. When a capacitive load exists at the output terminal, the capacitive load is quickly charged by the transistor $Tr_3$ so that the output voltage $V_{OUT}$ is pulled up and becomes H level.

As explained above, the output $Tr_4$ functions as an inverter transistor. In general, the TTL circuit employs a saturation type circuit which becomes saturated when the inverter transistor is turned ON. That is, the saturation area of the transistor is basically used in the TTL circuit, particularly, the output transistor passes a relatively large base current in order to raise the driving ability for the load connected to the next stage. For this reason, a driving factor representing a relationship between the base current and the collector current becomes, in general, 2 to 3. That is, the base current is multiplied by 2 to 3 times the collector current necessary for the switching operation flow in the base. This large base current has the result that when the output transistor is turned ON, that is, the output is L level, the saturated state becomes deep and the carrier accumulation at the base area is increased. As a countermeasure, although the discharge of base charges can be quickened by a gold diffusion method, there is a problem in that the switching time is delayed despite this method.

To solve this problem, there is a method using the SBD transistor, and the Schottky.barrier.diode (SBD), in which the forward direction voltage drop is rare, is provided between the base and the collector as shown in FIG. 2. The equivalent circuit of the output stage SBD transistor $TR_4$ is shown in FIG. 3 and the cross-sectional view thereof is shown in FIG. 4. In FIG. 3, the terminals B, C, and E correspond to the base, the collector, and the emitter terminals of the output transistor $TR_4$. SBD represents a Schottky.barrier.diode and constitutes a clamping circuit (in this case, only the SBD is shown and the clamping circuit becomes the "clamping element"). By this method, the Schottky. barrier.diode SBD is formed in the diffusion layer by utilizing the window of the same electrode as the base B, as shown in FIG. 4. Accordingly, the collector potential $V_O$ is clamped by the formula $V_O = V_{BE} - V_F$, since there is no resistor in the clamping circuit; where $V_{BE}$ represents a base-emitter voltage of the equivalent circuit of the transistor shown in FIG. 3, and $V_F$ represents a voltage drop of the SBD. For example, if $V_{BE}=0.8$ V and $V_F=0.4$ V, $V_O$ becomes 0.4 V. As shown by a chain dotted straight line II in FIG. 5, the margin can be obtained to a $V_{OLMAX}=0.5$ V since the $V_O$ is raised from 0.4 V, and thus the problem of saturation is solved and the delay of the switching speed is also solved. The straight line I shown by a dotted line in FIG. 5 represents the $I_O - V_O$ characteristic in the case that the clamping circuit by the SBD does not exist, as shown in FIG. 1.

As shown in FIG. 5, however, although the potential of the leading edge of the L level can be pulled down in this method, the collector resistance $R_O$ ($R_O = a + b + c$) is unconditionally decided based on the structure as shown by parasitic resistances a, b and c in FIG. 4. Therefore, the low level output voltage of the collector becomes the $I_O - V_O$ characteristic of the straight line II shifting toward the high potential direction for the $V_F$ of the Schottky.barrier.diode SBD.

Meanwhile, as another conventional example (not shown) of the SBD transistor, the structure wherein the Schottky·barrier·diode SBD is provided to a separate window from the window of the base electrode of the base side B, is disclosed (Japanese Examined Patent Publication No. 47-21743, Priority: U.S. patent application Ser. No. No. 683,238). In this case, as shown in FIG. 4, the parasitic resistance of the collector side up to the point $P_1$ or $P_2$ is denoted by the sum b+c of the burying resistance b and the collector resistance c, and the collector parasitic resistance of the emitter side is denoted by reference character a. When the window of the SBD and the base B are located at the same place or are located in the vicinity of the base B, the parasitic resistance is given by the relationship b+c>a. When the windows of the base B and the SBD are separated, an effect occurs whereby the resistance is inserted in series to the SBD under the parasitic resistance of the SBD side. Accordingly, as shown by the straight lines $II_X$, $II_Y$, and $II_Z$ of the chain dotted line in FIG. 5, it is possible to obtain the margin of the low level output voltage $V_{OL}$. However, since the parasitic resistance b+c of the collector side becomes larger than the parasitic resistance a of the emitter side, as explained above, when the collector current $I_O$ is intended to be set to a larger value, it is difficult to obtain such a large collector current since the $V_{OL}$ has reached the $V_{OLMAX}$, as shown by the straight lines $II_X$, $II_Y$, and $II_Z$.

As explained above, in the structure of the output transistor using a conventional SBD transistor, although the switching speed can be improved, there is a problem in that the margin of the $V_{OL}$ is reduced by dispersions of the forward direction voltage of the SBD and the base-emitter of the transistor. This means that an allowable extent of manufacturing dispersions becomes narrow, from the viewpoint of the manufacturer and as a result, the yield rate is lowered, the cost is increased, and moreover, the flexibilities of the circuit design of the device and of the layout on the printed circuit board are reduced, since the operation margin is reduced.

SUMMARY OF THE INVENTION

The object of the present invention is to improve the structure of the conventional semiconductor device, particularly, the SBD transistor. By this improvement, it is possible to increase the margin of the low level output voltage of the logic circuit, to obtain a larger collector saturation current, and to improve the switching speed. In accordance with the present invention in order to achieve this object, in the semiconductor device used for the logic circuit constituted by the SBD transistor, the clamping circuit provided to the collector-base is constituted by the Schottky.barrier diode and the series resistance in order to clamp the collector potential of the SBD transistor used as the output transistor, and the collector resistance is divided into suitable rates by the series resistance. Moreover, in accordance with the present invention, the window of the Schottky.barrier. diode SBD is separately provided in the neighborhood of the window of the collector C, and the internal resistances a+b of the emitter side (these internal resistances are the same as the parasitic resistances mentioned before but known as "internal resistances" because they are positively utilized in the present invention) are provided to a larger value than the internal resistance c of the collector side.

DESCRIPTION OF THE PREFERRED EMBODIMENT

Hereinafter, the embodiment of the semiconductor device according to the present invention will be explained in detail with reference to the accompanying drawings.

Figure 6:
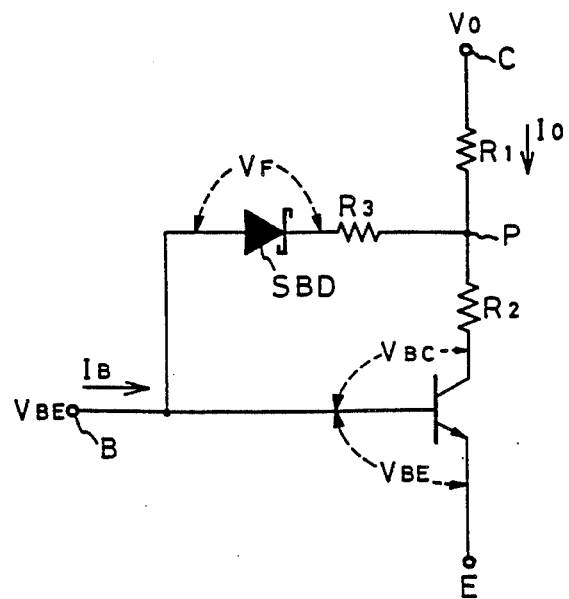
FIG. 6 is an equivalent circuit of the SBD transistor according to the present invention.

FIG. 6 is an equivalent circuit of the SBD transistor according to an embodiment of the present invention. In FIG. 6, the terminals B, C and E correspond to the base, the collector and the emitter terminals of the SBD transistor, respectively. As is obvious from the drawing, the clamping circuit consisting of the Schottky.barrier.-diode SBD and series connected resistance $R_3$ is provided between the base and the collector in order to suitably clamp the collector voltage $V_0$. When the clamping circuit is provided, it is connected to the common contact point P between the collector resistance $R_1$ of the collector side and the collector resistance $R_2$ of the emitter side. The resistance value is decided so as to obtain an optimal value by dividing the resistance among the resistance $R_3$ and the collector resistances $R_1$ and $R_2$. This is explained below.

In the equivalent circuit shown in FIG. 6, the collector output voltage $V_0$ is given below, $$V_0 = V_{BE} - V_F - R_3(I_B - I_0/h_{FE}) + R_1 I_0 \quad (1)$$

where, $V_{BE}$ is a base-emitter voltage, $V_F$ is a voltage drop of the Schottky.barrier.diode SBD, $I_B$ is a base current, and $I_0$ is collector current.

Moreover, the maximum value of the collector current $I_{0MAX}$ when the transistor reaches the saturation area is given by the following formula That is, $$V_{BC} = V_F + R_3(I_B - I_0/h_{FE}) + R_2(I_B - I_0/h_{FE} + I_0) \quad (2)$$

Where $V_{BC}$ is a collector base voltage.

When, $V_{BE}=V_{BC}=0.8$ V, $V_{DF}=0.4$ V, $h_{FE}=100$, $R_1=2$ Ω, $R_2=5$ Ω, and $I_B=2$ mA, the relationships among $R_3$, $V_0$, $I_{0MAX}$ are given by the formulas (1) and (2) as follows. In this case, the current unit is mA and resistance unit is kΩ.

$$V_0 = 0.4 - 2R_3 + \frac{10R_3 + 2}{1000} I_0 \quad (3)$$

$$I_{0MAX} = \frac{39 - 200R_3}{0.495 - R_3} \quad (4)$$

Figure 1:
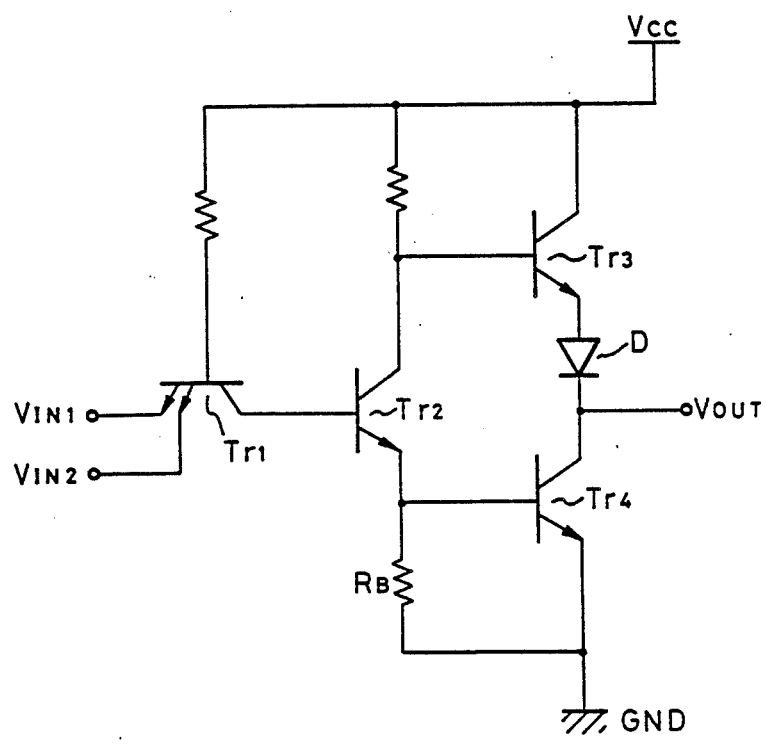
FIG. 1 is one example of a conventional TTL circuit.
Figure 2:
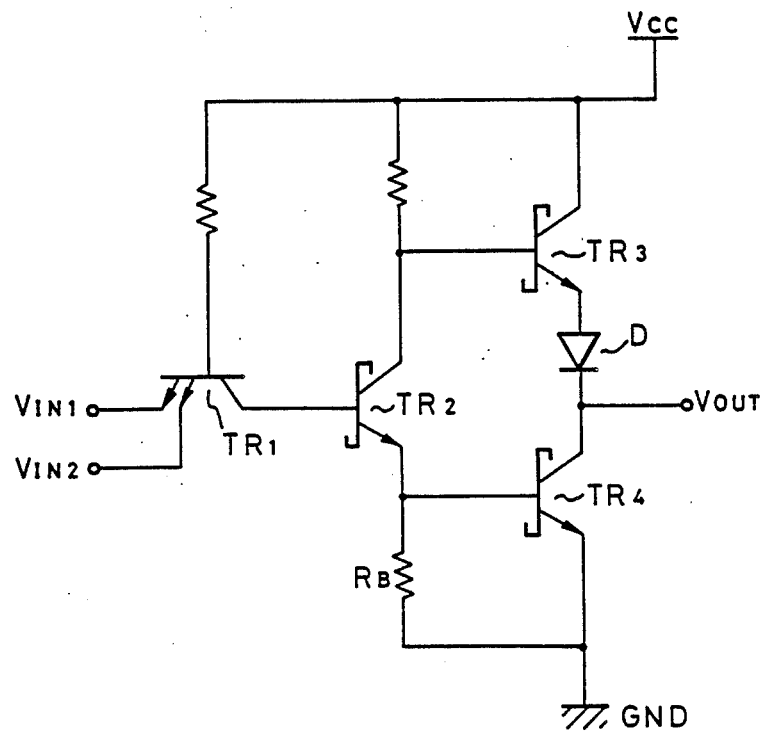
FIG. 2 is one example of a conventional TTL circuit using the SBD transistor.
Figure 3:
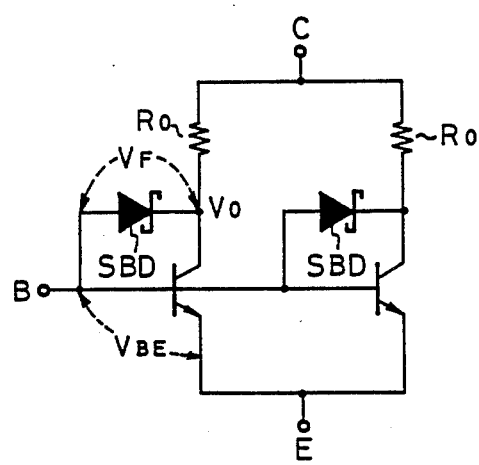
FIG. 3 is an equivalent circuit of the SBD transistor used for the circuit shown in FIG. 2.
Figure 11:
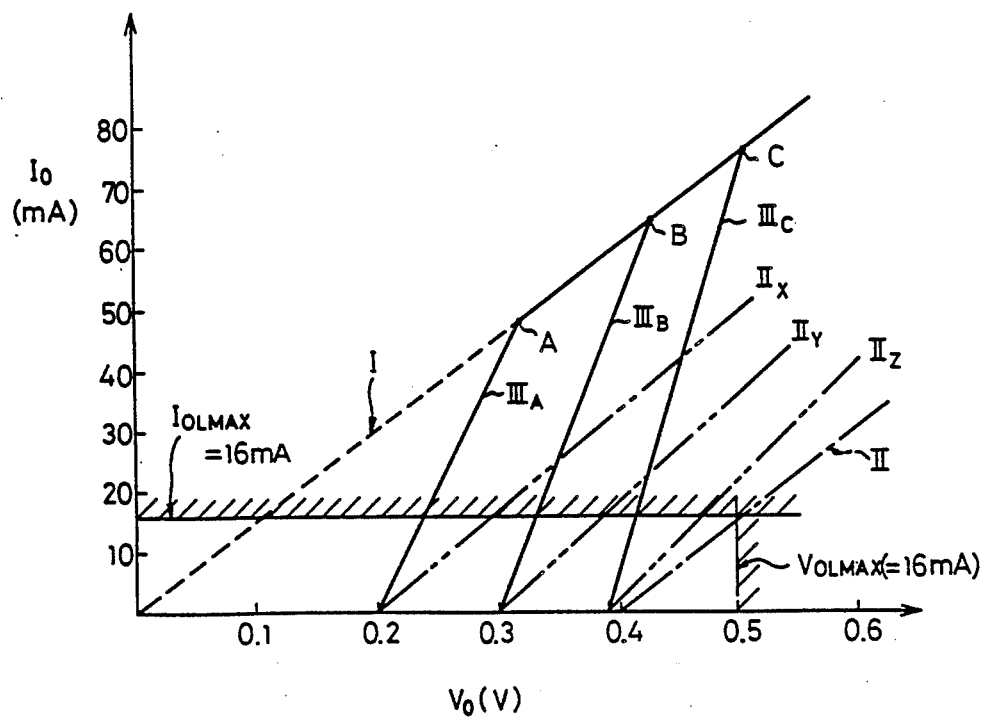
FIG. 11 is a collector current-collector voltage graph for the SBD transistor according to the present invention and compared with a conventional transistor.

From these formulas, the $I_0 - V_0$ characteristic of the SBD transistor is obtained as shown by solid lines in FIG. 11. As is obvious from FIG. 11, the influences of the series resistance $R_3$ on the collector output $V_0$ are shown by the straight lines $III_A$, $III_B$, and $III_C$. That is, these straight lines are given by the formula (1) for each of the above-mentioned values and resistance $R_3$, which is given by 100, 50 and 10 Ω, respectively. In these straight lines $III_A$, $III_B$ and $III_C$, the resistance $R_3$ corresponds to 100, 50 and 10 Ω, respectively. Moreover, the points A, B and C indicate the current value $I_{0MAX}$ in the saturation area. As previously explained, the straight line I indicates the case of the conventional circuit in which the SBD transistor is not used, as shown in FIG. 1. The straight line II indicates the case of the other conventional circuit in which the SBD transistor is used as shown in FIG. 2. The straight lines $II_X$, $II_Y$ and $II_Z$ indicate the case wherein the SBD is provided in the vicinity of the window of the base B. In this case, since the resistance $R_1$ becomes larger than the resistance $R_2$ under the structural limitation, a sufficient margin is not given to the collector current $I_0$.

The following table denotes the summary of the characteristic shown in FIG. 11.

TABLE

| $R_3$ ($\Omega$) | FORMULA (1) | $V_{OL}$ LEADING POINT (V) | EFFECTIVE COLLECTOR RESISTANCE ($\Omega$) | SATURATION $I_{0MAX}$ (mA) |
| --- | --- | --- | --- | --- |
| 100 | $V_0 = 0.2 + \frac{3.0}{1000} I_0$ | 0.2 | 3.0 | 48.1 |
| 50 | $V_0 = 0.3 + \frac{2.5}{1000} I_0$ | 0.3 | 2.5 | 65.2 |
| 10 | $V_0 = 0.38 + \frac{2.1}{1000} I_0$ | 0.38 | 2.1 | 76.3 |

As shown in the Table and by the slant of the straight lines $III_A$, $III_B$ and $III_C$, the effective collector resistance is reduced. This is because the current flowing from the clamping circuit (SBD+$R_3$) to the point P in FIG. 6 is changed in response to the change of the base current $I_B$ and the voltage drop at the resistance $R_3$ is also changed. In this case, when the current flowing in the clamping circuit is decreased, the voltage of the resistance $R_3$ is also dropped so that the potential of the point P is substantially pulled up and the collector resistance functions as if it is apparently reduced.

Figure 4:
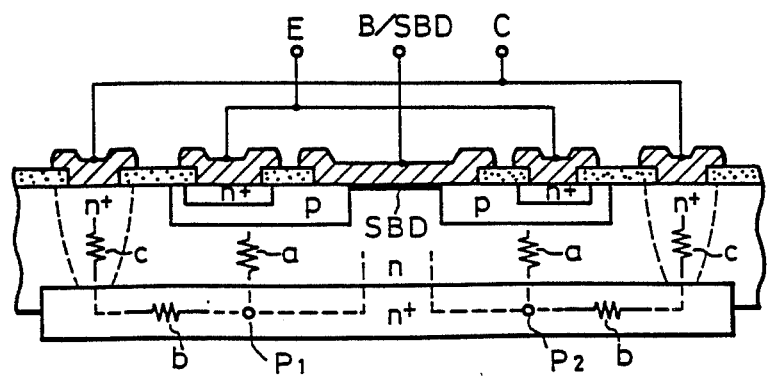
FIG. 4 is a structural cross sectional view of the SBD transistor shown in FIG. 3.
Figure 5:
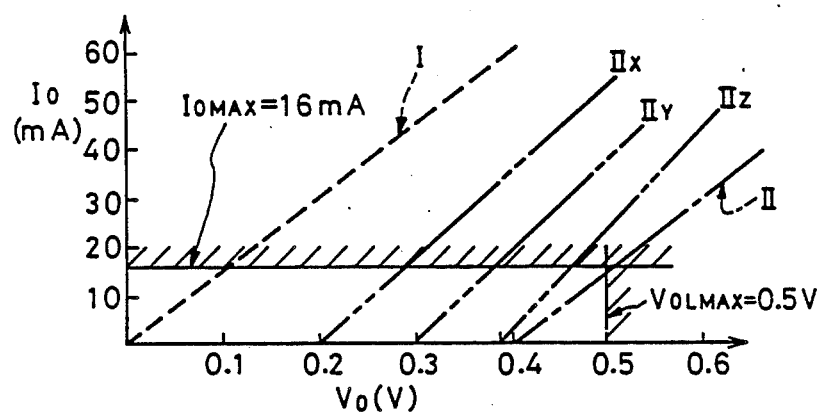
FIG. 5 is a collector current-collector voltage graph for a conventional output transistor.
Figure 7:
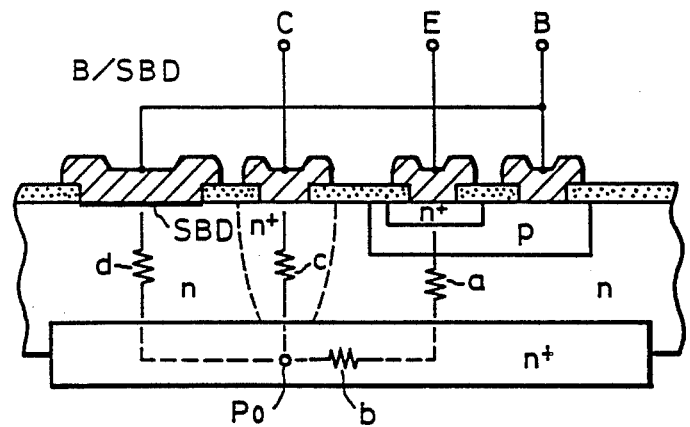
FIG. 7 is a structural cross sectional view of one embodiment of the SBD transistor shown in FIG. 6.
Figure 8:
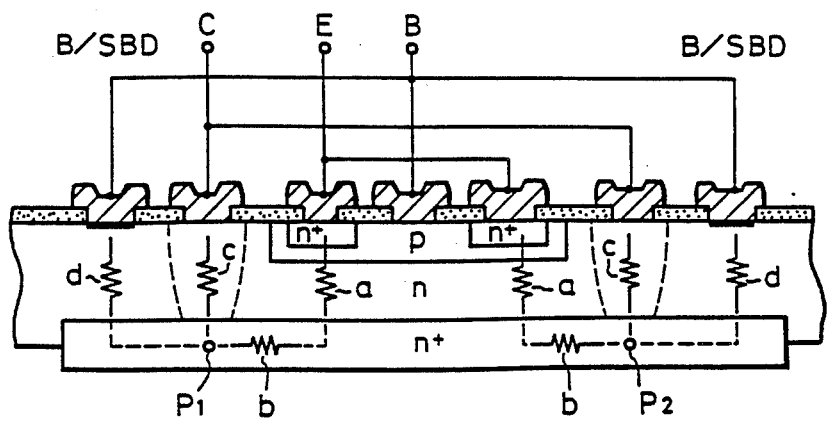
FIG. 8 is a structural cross sectional view of the another embodiment of the SBD transistor shown in FIG. 6.

FIGS. 7 and 8 are structural cross sectional views of the SBD transistor of the equivalent circuit shown in FIG. 6. In the resistances $R_1$, $R_2$ and $R_3$ of the equivalent circuit shown in FIG. 6, the relationships among $R_1=c$, $R_2=a+b$, and $R_3=d$ are obtained for the point $P_0$, regarding the internal resistance c of the collector side, the internal collector resistance a of the emitter side, the burying resistance b, and the internal resistance d of the SBD. As shown in FIG. 7, the feature of the present invention lies in that the window forming the electrode of the Schottky-barrier-diode SBD is provided in the vicinity of the outside of the window forming the electrode of the collector C as a window separated from the window of the base B. It is easy to achieve the relationship of the resistance $R_1 < R_2$ by the above structure. FIG. 8 shows the case of a pair of the structures shown in FIG. 7. As is obvious from the drawing, each SBD is provided in the vicinity of the window of the collector C. The relationship of the resistance $R_1 < R_2$ can be obtained for each of points $P_1$ and $P_2$ as well as FIG. 7. As explained above, the window of the conventional SBD is provided to the same window as the base B, as shown in FIG. 4, or provided in the vicinity of the base B (not shown). Therefore, in the former, only the parasitic resistances a, b and c are provided, and the resistance $R_3$ according to the present invention is not provided. In the latter, the relationship of the resistance $R_1 > R_2$ occurs from the structural limitation, thus the collector current $I_0$ can not be obtained to a sufficiently large value.

As is obvious from the structural cross sectional views in FIGS. 7 and 8, as the metal wiring layer, the first layer is formed as the electrodes of the base B, the collector C, the emitter E and the Schottky. barrier.diode SBD, and the second layer is formed for the wiring to the above electrodes.

Figure 9:
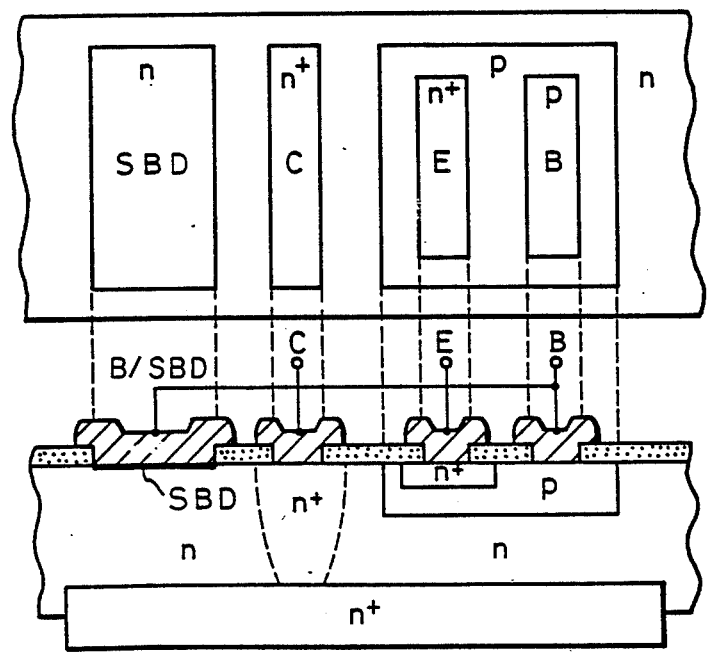
FIG. 9 is a plan view of the structure shown in FIG. 7.
Figure 10:
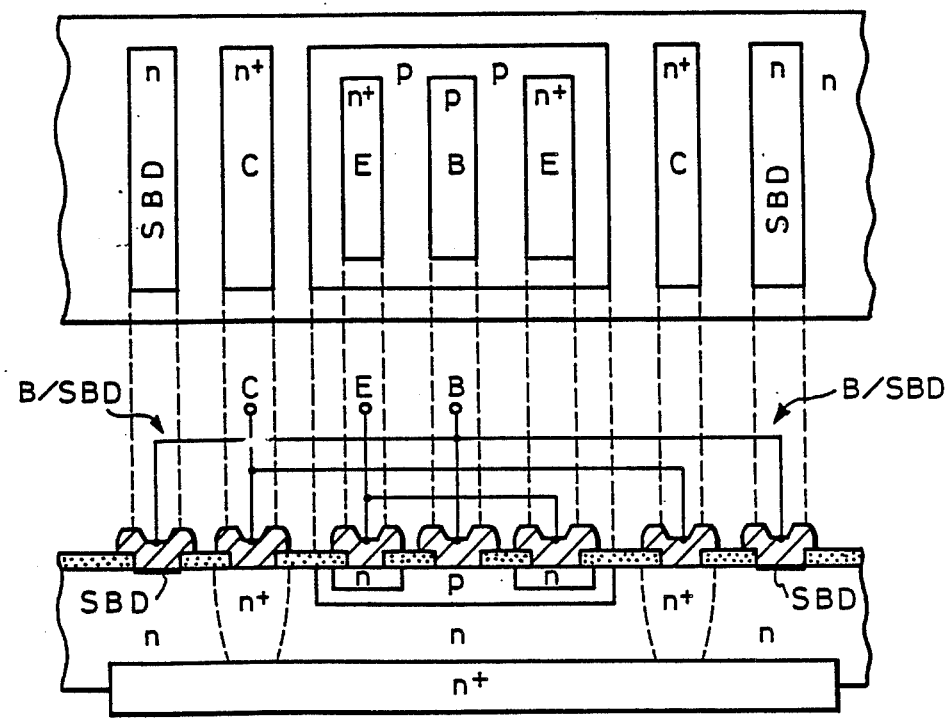
FIG. 10 is a plan view of the structure shown in FIG. 8.

FIGS. 9 and 10 are plan views of the structures shown in FIGS. 7 and 8. As is obvious from the drawings, the Schottky-barrier-diode SBD of the SBD transistor according to the present invention is provided in the vicinity of the outside of the collector electrode C, based on the above structure, and it is possible to provided the relationship of the resistance $R_1 < R_2$, and the above explained effects can be obtained by the multiplication effect through the series resistance $R_3$.

FIG. 11 is a characteristic graph for comparing the present invention and the conventional art. It is possible to obtain a sufficient margin of the low level output voltage $V_{OL}$ as shown by the straight lines $III_A$, $III_B$ and $III_C$, moreover, to obtain a sufficient margin of the collector current $I_0$, as is obvious from the slants of the straight lines $III_A$, $III_B$ and $III_C$.

As explained above, in accordance with the present invention, in the output of the logic circuit using the SBD transistor, since the clamping circuit for the collector potential of the SBD transistor is constituted by the Schottky-barrier-diode and the series resistance optimally set with the collector resistance, the leading potential from the low level of the collector output voltage can be pulled down, and the margin up to the saturation voltage can be increased, and thus the effective collector resistance from the output side can be reduced. In this case, the clamping to the collector potential is performed, and the delay of the switching speed caused by the saturation of the transistor can be simultaneously eliminated.

Although the above embodiment is directed to the TTL logic circuit, the present invention can be applied to the ECL logic circuit.

What is claimed is:

1. A semiconductor device used for a logic circuit including a Schottky.barrier.diode clamping transistor, comprising:

a buried layer of a first conductivity type having a first impurity concentration;

a collector layer of the first conductivity type on said buried layer, said collector layer having a second impurity concentration which is lower than the first impurity concentration, said collector layer further having a doped contact region of a third impurity concentration higher than the second impurity concentration, said doped contact region being formed between said buried layer and the surface of said collector layer;

a base region of a second conductivity type which is opposite to the first conductivity type, said base region being formed at the surface of said collector layer;

an emitter region of the first conductivity type formed in the base region;

an emitter electrode formed on said emitter region;

a base electrode formed on said base region;

a collector electrode formed on said doped contact region of said collector layer; and a Schottky contact formed on a portion of said collector layer having the second impurity concentration, said Schottky contact being coupled to said base electrode, a third resistance extending from said Schottky contact through said collector layer, a first resistance extending from said collector contact through said doped contact region to a point in said buried layer, and a second resistance extending from a PN junction between said base region and said collector layer under said emitter region through the collector layer to the point in said buried layer, said first resistance being smaller than said second resistance.

2. A semiconductor device as claimed in claim 1, wherein:
   said collector electrode formed on said doped contact region is positioned between said base region and said Schottky contact; and
   said point in said buried layer is under said doped contact region.

3. A semiconductor device used for a logic circuit including a Schottky.barrier.diode clamping transistor, comprising:
   a substrate;
   a semiconductor collector layer of a first conductivity type formed on said substrate;
   a base region of a second conductivity type opposite to the first conductivity type, said base region formed in and at the surface of said collector layer;
   an emitter region of the first conductivity type formed in said base region;
   an emitter electrode formed on said emitter region;
   a base electrode formed on said base region;
   a collector electrode formed on the surface of said collector layer and positioned adjacent to said emitter electrode; and
   a Schottky contact formed on a portion of the surface of said collector layer and coupled to said base electrode, said collector layer including a first resistance and a second resistance serially formed from said collector electrode to a PN junction between said base region and said collector layer, and a third resistance formed from said Schottky contact to a point between said first resistance and said second resistance, said first resistance being smaller than said second resistance.

4. A semiconductor device as claimed in claim 3, further comprising:
   a buried layer of the first conductivity type having a higher impurity concentration than the second impurity concentration of said collector layer, said buried layer being formed between said substrate and said collector layer and positioned under said emitter region, said collector electrode and said Schottky contact; and
   a collector contact region of the first conductivity type having a higher impurity concentration than the second impurity concentration of said collector layer, said collector contact region being formed in said collector layer between said collector electrode and said buried layer, said collector electrode being formed between said emitter electrode and said Schottky contact.

5. A semiconductor device as claimed in claim 4, further comprising:
   an additional collector contact region, an additional collector electrode, and an additional Schottky contact, said additional collector electrode being positioned between said emitter electrode and said additional Schottky contact.

* * * * *